United States Patent [19]

Drucker

[11] Patent Number: 5,591,984
[45] Date of Patent: Jan. 7, 1997

[54] CURRENT SENSING DAISY-CHAIN BYPASS ARRANGEMENT

[75] Inventor: Kevin D. Drucker, Lafayette Hill, Pa.

[73] Assignee: The Whitaker Corporation, Wilmington, Del.

[21] Appl. No.: 490,968

[22] Filed: Jun. 15, 1995

[51] Int. Cl.$^6$ ............................ G02B 27/00; G01R 27/00
[52] U.S. Cl. .................. 250/551; 395/280; 364/941.91
[58] Field of Search ........................... 250/551, 214 R, 250/214 SW; 395/325, 575; 340/653, 654; 364/941.91, 480, 483

[56] References Cited

U.S. PATENT DOCUMENTS

| | | | |
|---|---|---|---|
| 4,914,625 | 4/1990 | Billian | 364/900 |
| 5,117,494 | 5/1992 | Costes et al. | 395/575 |
| 5,278,422 | 1/1994 | Kato et al. | 250/551 |
| 5,293,589 | 3/1994 | Skordou et al. | 395/325 |
| 5,422,493 | 6/1995 | Kestenbaum et al. | 250/551 |
| 5,530,653 | 6/1996 | Chung et al. | 250/551 |

*Primary Examiner*—Edward P. Westin
*Assistant Examiner*—John R. Lee

[57] ABSTRACT

An electronic system having a backplane defining a plurality of slots each for demountably holding a respective one of a plurality of plug-in modules. The backplane includes a power trace extending to all of the slots for supplying power to all of the slots and a signal trace for carrying a daisy-chained signal to all of the slots. Associated with each of the slots is an arrangement for selectively bypassing the daisy-chained signal past the slot when no module is present in that slot. The arrangement comprises a controllable signal transmission device coupled to the signal trace for selectively providing a conductive path bypassing the slot and a current sensing switch coupled to a branch of the power trace which extends to the slot. The current sensing switch is responsive to current flow through the power trace to the slot for controlling the transmission device to close the conductive path in the absence of current flow and to open the conductive path in the presence of current flow.

6 Claims, 2 Drawing Sheets

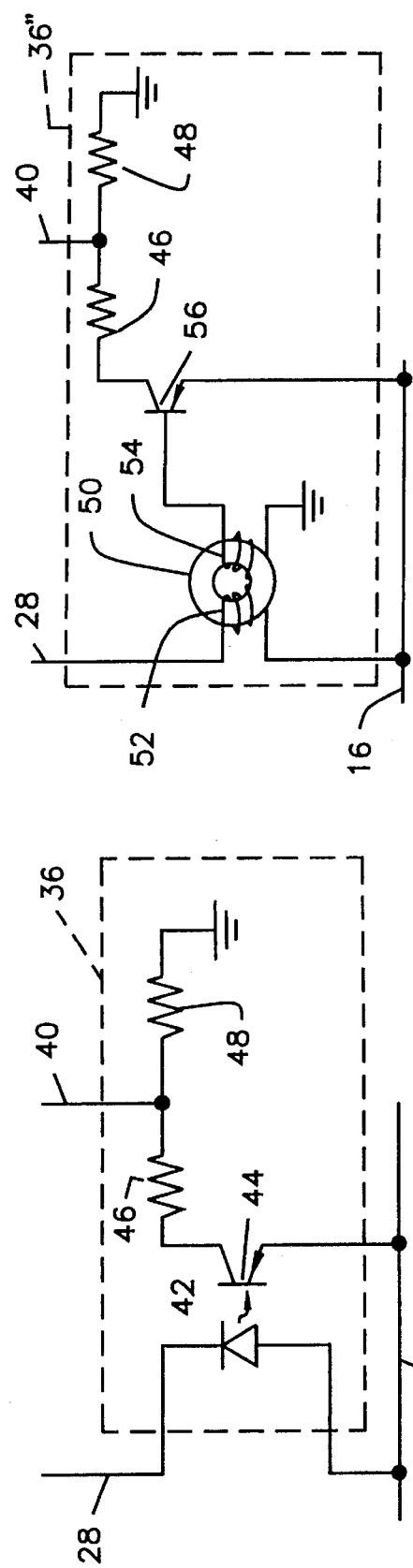
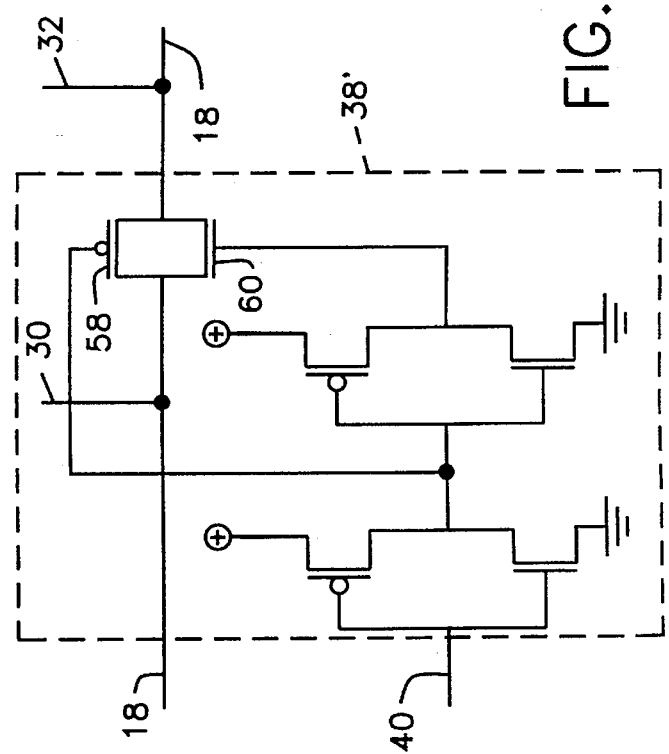
FIG. 3
FIG. 4
FIG. 2

CURRENT SENSING DAISY-CHAIN BYPASS ARRANGEMENT

BACKGROUND OF THE INVENTION

This invention relates to electronic systems having a backplane for supporting plug-in modules wherein a signal is daisy-chained through the modules and, more particularly, to an arrangement in such a system for bypassing the daisy-chained signal when a module is absent from its assigned "slot" on the backplane.

Many electronic systems, such as computers, have a backplane (or mother board) on which are mounted connectors defining slots into which plug-in modules (or daughter cards) may be demountably secured. The backplane provides wiring (i.e., printed circuit traces) to effect communications between the modules and to provide a supply of power to the modules. Many such systems include a signal line on the backplane for carrying a daisy-chained signal through all of the modules present in the system. Since a given slot may or may not hold a module, some means must be provided for bypassing the daisy-chained signal around an empty slot and passing the daisy-chained signal through the slot when a module is present therein. Accordingly, it is an object of this invention to provide an arrangement for effecting such selective bypass function.

It is known to provide the selective bypass function by using manual or mechanical jumpering schemes. However, such schemes have proven to be unreliable. It is therefore a further object of this invention to provide a selective bypass arrangement which utilizes reliable non-mechanical devices.

SUMMARY OF THE INVENTION

The foregoing and additional objects are attained in accordance with the principles of this invention by providing an arrangement for use in an electronic system which has a backplane defining a plurality of slots each for demountably holding a respective one of a plurality of plug-in modules. The backplane includes a first conductive trace extending to all of the slots for supplying power to all of the slots and a second conductive trace for carrying a daisy-chained signal to all of the slots. A respective arrangement is associated with each of the slots for selectively bypassing the daisy-chained signal past that each slot when no module is present therein. The arrangement comprises controllable signal transmission means coupled to the second trace for selectively providing a conductive path bypassing that each slot and current sensing switch means coupled to the first trace extending to that each slot. The current sensing switch means is responsive to current flow through the first trace to that each slot for controlling the signal transmission means to either close the conductive path in the absence of current flow or to open the conductive path in the presence of current flow.

In accordance with an aspect of this invention, the current sensing switch means includes an opto-isolator having a light emitting diode in series with the first trace.

In accordance with another aspect of this invention, the current sensing switch means includes a first inductive winding in series with the first trace and a second inductive winding magnetically coupled to the first winding.

BRIEF DESCRIPTION OF THE DRAWINGS

The foregoing will be more readily apparent upon reading the following description in conjunction with the drawings in which like elements in different figures thereof are identified by the same reference numeral and wherein:

FIG. 2 illustrates a first embodiment of a current sensing switch according to this invention;

FIG. 3 illustrates a second embodiment of a current sensing switch according to this invention; and FIG. 4 shows an illustrative bi-directional transmission gate according to this invention.

DETAILED DESCRIPTION

Figure 1:
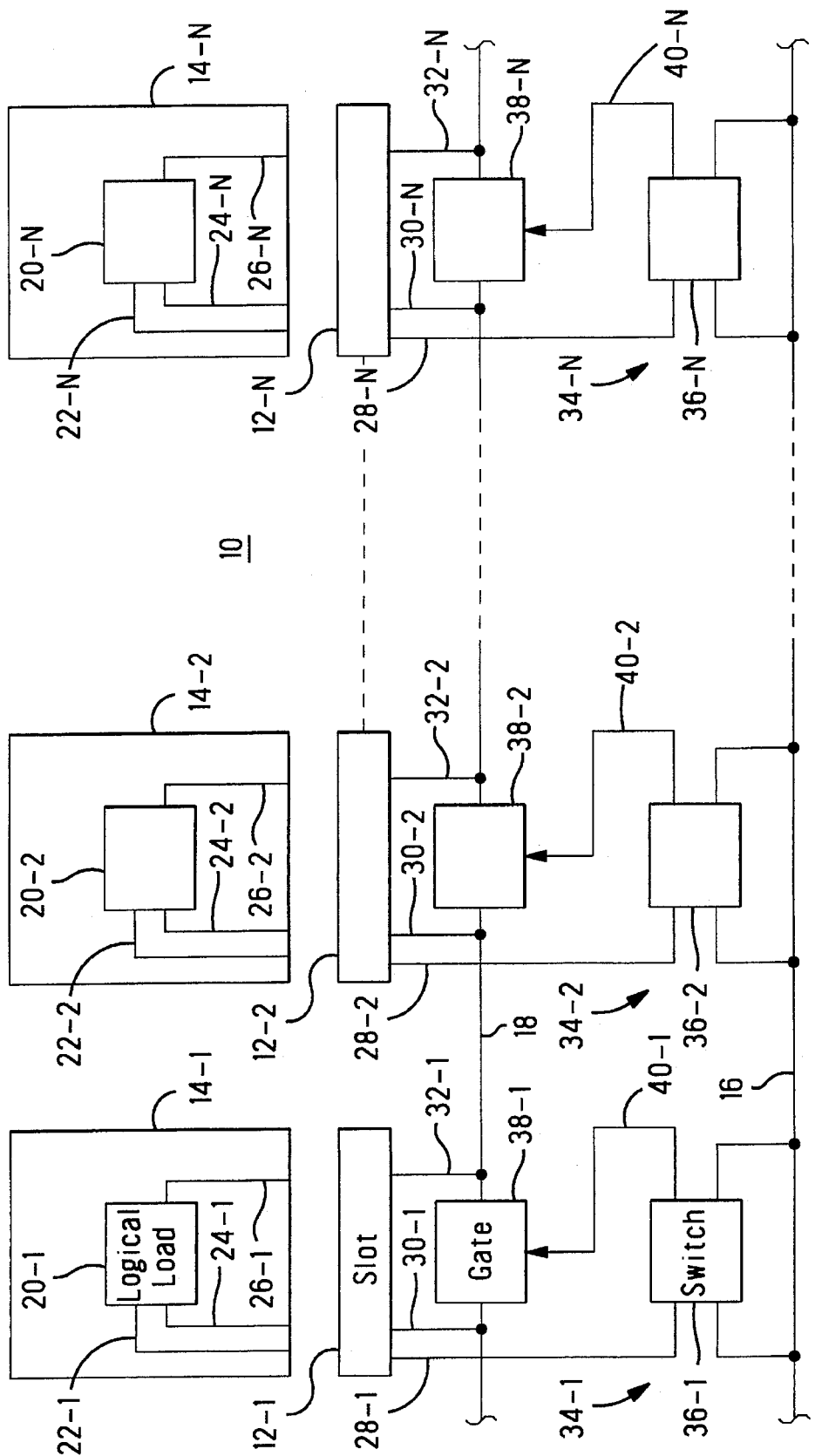
FIG. 1 is a block diagram of an electronic system having incorporated therein arrangements constructed in accordance with the principles of this invention.

Referring now to the drawings, FIG. 1 shows a backplane (or mother board) 10 having mounted thereon a plurality of connectors 12-1, 12-2, . . . , 12-N defining "slots" for demountably holding respective plug-in modules (or daughter cards) 14-1, 14-2, . . . , 14-N. The backplane 10 includes a first conductive power trace 16 which carries power (from a source not shown) for supplying all of the slots 12 and the modules 14 secured therein. The backplane 10 further includes a second conductive signal trace 18 which branches off to all the connectors 12 and carries a daisy-chained signal (from a source not shown). It is understood that in certain applications the backplane 10 may be multi-layer board.

Each of the plug-in modules 14 includes logic/load circuitry 20, as well as connections (i.e., conductive traces on the daughter cards) which extend to an edge of the module 14 for connection to suitable traces on the backplane 10 via the connector 12 when the module 14 is installed therein, as is well known in the art. Thus, the module 14 includes a power trace 22 which is coupled to the power trace 16 on the backplane 10 when the module 14 is installed in the connector 12 so as to provide power for the logic/load 20. The module 14 further includes the traces 24 and 26 for continuing the daisy-chain signal trace 18 through the logic/load circuitry 20 when the module 14 is installed in the connector 12. Thus, on the backplane 10, for each of the connectors 12 there is a power trace extension 28 which is coupled to the power trace 16 and is connected to the power trace 22 of the module 14 when the module 14 is installed in the connector 12. Similarly, on the backplane 10 there are traces 30 and 32 which are extensions of the daisy-chain signal trace 18 and are connected to the traces 24 and 26, respectively, on the module 14 when the module 14 is installed in the connector 12. The foregoing is well known and conventional in the art and does not form a part of the present invention.

In order to have the signal on the daisy-chain signal trace 18 bypass an empty slot without requiring the use of manual or mechanical jumpering, the present invention takes advantage of the fact that current flows through a power trace extension 28 only when a module is plugged into the connector associated with that power trace extension, otherwise there is no current flow in the power trace extension 28. (In the situation where the backplane 10 is a multi-layer board, the power trace 16 may be an entire layer and a connector pin would function as the power trace extension 28.) Accordingly, a selective bypass arrangement 34 is provided for each of the slots 12. The bypass arrangement 34 includes a current sensing switch 36 and a controllable signal transmission device (e.g., transmission gate) 38, along with associated wiring. The current sensing switch 36 has its power transmission leads connected in series between the power trace extension 28 and the power trace 16 and its control transmission leads coupled between a control input of the transmission gate 38 and the power trace 16. The transmission gate 38 selectively provides a bypass across the daisy-chain extension traces 30 and 32. Thus, when the current sensing switch 36 detects current flow through the power trace extension 28 due to the presence of a module 14 installed in the associated connector 12, the current sensing switch 36 provides a signal over the control lead 40 to cause the transmission gate 38 to open its internal conductive path and allow the daisy-chained signal to pass to the associated module 14 through the traces 30 and 32. Conversely, in the absence of current through the power trace extension 28, the signal on the control lead 40 is such that it causes the transmission gate 38 to close its internal conductive path, which bypasses the associated connector 12, and allows the daisy-chained signal on the signal trace 18 to skip that slot.

FIG. 2 illustrates a first embodiment 36' for the current sensing switch. As illustrated, the current sensing switch includes an opto-isolator having a light emitting diode 42 in series with the power trace extension 28. The opto-isolator further includes a phototransistor 44 optically coupled to the light emitting diode 42 and connected between the primary power trace 16 and the resistive voltage divider made up of the resistors 46 and 48, at the junction of which is connected the control lead 40. The values of the resistors 46 and 48 are selected dependent upon whether the control input of the transmission gate 38 requires an active high or an active low (i.e., pull up or pull down) and therefore one or the other of the resistors 46, 48 may be omitted.

In some applications, for example where there is relatively high current flow through the power trace extension 28, the use of an opto-isolator as in FIG. 2 is inappropriate. An alterative current sensing switch 36" is illustrated in FIG. 3. In this embodiment, a ferro-magnetic core 50 has wrapped thereabout a first inductive winding 52 and a second inductive winding 54 which are magnetically coupled to each other. The first winding 52 is in series with the power trace extension 28. Since during normal operation of the logic/load circuitry 20 in a module 14, there results a varying current flow through the power trace extension 28, this sets up a varying magnetic field in the first winding 52, which results in current flow being induced through the second winding 54 to saturate the transistor 56. The transistor 56 is coupled to the control lead 40 through the resistive voltage divider made up of the resistors 46 and 48, which functions in the same manner as the voltage divider of FIG. 2.

FIG. 4 illustrates a bi-directional transmission gate 38' with an active high enable over the control lead 40 at its control input. The selectively activated conductive bypass is formed by the P-MOSFET 58 and the N-MOSFET 60 connected together. The other MOSFET pairs act as inverter drivers for the transistors 58 and 60.

Other implementations of the signal transmission function are possible. Thus, for example, the signal transmission function as described and claimed herein is intended to also cover a tri-state buffer, which is a uni-directional device. If such tri-state buffers are utilized and bi-directional signal transmission is desired, then a pair of anti-parallel buffers, with separate enabling inputs, would be required. Other controllable signal transmission devices may be utilized within the parameters of this invention.

Accordingly, there has been disclosed an improved daisy-chain bypass arrangement. It is understood that the above-described embodiments are merely illustrative of the application of the principles of this invention. Numerous other embodiments may be devised by those skilled in the art without departing from the spirit and scope of this invention, which is intended to be limited only by the scope of the appended claims.

What is claimed is:

1. In an electronic system having a backplane defining a plurality of slots each for demountably holding a respective one of a plurality of plug-in modules, said backplane including a first conductive trace extending to all of said slots for supplying power to all of said slots and a second conductive trace for carrying a daisy-chained signal to all of said slots, a respective arrangement associated with each of said slots for selectively bypassing said daisy-chained signal past said each slot when no module is present in said each slot, the arrangement comprising:

controllable signal transmission means coupled to said second trace for selectively providing a conductive path bypassing said each slot; and current sensing means coupled to said first trace extending to said each slot and responsive to current flow through said first trace to said each slot for controlling said signal transmission means:
a) to close said conductive path in the absence of said current flow; and
b) to open said conductive path in the presence of said current flow.

2. The arrangement according to claim 1 wherein said current sensing means includes an opto-isolator having a light emitting diode in series with said first trace.

3. The arrangement according to claim 1 wherein said current sensing means includes a first inductive winding in series with said first trace and a second inductive winding magnetically coupled to said first winding.

4. The arrangement according to claim 1 wherein said current sensing means includes a resistive voltage divider and means for coupling said signal transmission means to an intermediate tap of said voltage divider;

whereby the control of said signal transmission means can be either of the pull-up or pull-down type depending on the selected values of the resistors making up the voltage divider.

5. The arrangement according to claim 1 wherein said signal transmission means conductive path provides bi-directional signal transmission.

6. In an electronic system having a backplane defining a plurality of slots each for demountably holding a respective one of a plurality of plug-in modules, said backplane including a first conductive trace extending to all of said slots for supplying power to all of said slots and a second conductive trace for carrying a daisy-chained signal to all of said slots, a method for selectively bypassing said daisy-chained signal past a particular slot when no module is present in that slot, the method comprising the steps of:

providing a controllable signal transmission device coupled to said second trace to selectively provide a conductive path bypassing that particular slot;

sensing current flow from said first trace to that particular slot;

closing said conductive path in the absence of current flow; and opening said conductive path in the presence of current flow.

\* \* \* \* \*